(12) United States Patent
Meisenzahl et al.

(10) Patent No.: US 7,893,981 B2
(45) Date of Patent: Feb. 22, 2011

(54) IMAGE SENSOR WITH VARIABLE RESOLUTION AND SENSITIVITY

(75) Inventors: Eric J. Meisenzahl, Ontario, NY (US); John P. McCarten, Penfield, NY (US)

(73) Assignee: Eastman Kodak Company, Rochester, NY (US)

( * ) Notice: Subject to any disclaimer, the term of this patent is extended or adjusted under 35 U.S.C. 154(b) by 266 days.

(21) Appl. No.: 11/680,078

(22) Filed: Feb. 28, 2007

(65) Prior Publication Data

US 2008/0204585 A1    Aug. 28, 2008

(51) Int. Cl.
*H04N 3/14* (2006.01)
(52) U.S. Cl. .................. 348/312; 348/298; 348/303; 348/311
(58) Field of Classification Search ............ 348/322, 348/312
See application file for complete search history.

(56) References Cited

U.S. PATENT DOCUMENTS

| | | | |
|---|---|---|---|
| 4,613,402 A | | 9/1986 | Losee et al. |
| 4,763,204 A | * | 8/1988 | Kinoshita et al. ........... 386/120 |
| 5,130,774 A | | 7/1992 | Stevens et al. |
| 5,773,324 A | * | 6/1998 | Yoon et al. ................... 438/144 |
| 6,198,507 B1 | * | 3/2001 | Ishigami .................... 348/273 |
| 6,507,365 B1 | * | 1/2003 | Nakamura et al. .......... 348/296 |
| 6,624,453 B2 | | 9/2003 | Banghart et al. |
| 6,686,960 B2 | * | 2/2004 | Iizuka ........................ 348/273 |
| 7,002,630 B1 | * | 2/2006 | Iizuka ........................ 348/322 |
| 7,564,492 B2 | * | 7/2009 | Nagayoshi et al. .......... 348/273 |
| 7,659,933 B2 | * | 2/2010 | Fujita et al. ................. 348/314 |
| 7,796,175 B2 | * | 9/2010 | Inoue et al. ................. 348/311 |
| 2004/0150733 A1 | | 8/2004 | Nagayoshi et al. |
| 2005/0017154 A1 | * | 1/2005 | Ozumi ..................... 250/208.1 |
| 2005/0117043 A1 | * | 6/2005 | Fujii et al. .................. 348/311 |
| 2005/0280726 A1 | | 12/2005 | Parks et al. |
| 2006/0109352 A1 | | 5/2006 | Draijer |
| 2006/0125943 A1 | | 6/2006 | Parks |
| 2007/0013799 A1 | * | 1/2007 | Hirota et al. ................ 348/311 |
| 2010/0097505 A1 | * | 4/2010 | Meisenzahl ................. 348/273 |

OTHER PUBLICATIONS

James R. Janesick, "Scientific Charge-Coupled Devices", SPIE Press, 2001, Chapter 5.4, pp. 449-450.

* cited by examiner

*Primary Examiner*—Jason Chan
*Assistant Examiner*—Cynthia Calderon
(74) *Attorney, Agent, or Firm*—Peyton C. Watkins; Nancy R. Simon (57) ABSTRACT

A charge-coupled device image sensor includes (a) a two-dimensional array of pixels having a plurality of rows and columns, the two-dimensional array includes: (i) a plurality of gates arranged as a charge-coupled device; wherein the array further includes a plurality of charge-coupled devices that are arranged to be clocked by one or more common timing signals; (ii) a transition region, electrically connected to the array, having a first and second row of gates in which the second row is electrically mated into a plurality of first and second pairs of gates in which first pairs of gates are clocked by a first common timing signal and second pairs of gates are clocked by a second common timing signal; wherein the first row of gates are all clocked with a third common timing signal; and (b) a horizontal shift register adjacent the second row of gates for receiving charge from the second row of gates.

5 Claims, 8 Drawing Sheets

| | $C_{n-2}$ | $C_{n-1}$ | $C_n$ | $C_{n+1}$ | $C_{n+2}$ | $C_{n+3}$ | $C_{n+4}$ | $C_{n+5}$ |
|---|---|---|---|---|---|---|---|---|
| V2 / V1 | | | B | Gb | B | Gb | | |
| V2 / V1 | | | Gr | R | Gr | R | | |
| V2 / V1 | | | B | Gb | B | Gb | | |
| V2 / V1L | | | Gr | R | Gr | R | | |
| V2A/V2B | | | | | | | | |
| HCCD | | | | | | | | |

PATTERN AT t0

FIG. 2b

| | $C_{n-2}$ | $C_{n-1}$ | $C_n$ | $C_{n+1}$ | $C_{n+2}$ | $C_{n+3}$ | $C_{n+4}$ | $C_{n+5}$ |
|---|---|---|---|---|---|---|---|---|
| V2 / V1 | | | B | Gb | B | Gb | | |
| V2 / V1 | | | Gr | R | Gr | R | | |
| V2 / V1 | | | B | Gb | B | Gb | | |
| V2 / V1L | | | Gr | R | Gr | R | | |
| V2A/V2B | | | | | | | | |
| HCCD | | | | | | | | |

PATTERN AT t1

FIG. 2c

| | $C_{n-2}$ | $C_{n-1}$ | $C_n$ | $C_{n+1}$ | $C_{n+2}$ | $C_{n+3}$ | $C_{n+4}$ | $C_{n+5}$ |
|---|---|---|---|---|---|---|---|---|
| V2 / V1 | | | B | Gb | B | Gb | | |
| V2 / V1 | | | Gr | R | Gr | R | | |
| V2 / V1 | | | B | Gb | B | Gb | | |
| V2 / V1L | | | Gr | R | | | | |
| V2A/V2B | | | | | | | | |
| HCCD | | | | | Gr | R | | |

PATTERN AT t2

FIG. 2d  
PATTERN AT t3

FIG. 2e  
PATTERN AT t4

FIG. 2f  
PATTERN AT t5

IMAGE SENSOR WITH VARIABLE RESOLUTION AND SENSITIVITY

FIELD OF THE INVENTION

The invention relates generally to the field of color CCD image sensors and, more particularly, to such image sensors having variable resolution with reduced noise.

BACKGROUND OF THE INVENTION

Three important attributes of an image sensor are resolution, sensitivity and in many cases frame rate. Higher sensor resolutions (more pixels) generally produce images with finer detail whereas higher sensitivity enables the sensor to better resolve faint scenes with acceptable signal to noise ratios. An image sensor with a higher frame rate enables the ability to capture multiple images within a close time period and is particularly useful in scenes with object movement.

For a given optical format, resolution is generally improved by decreasing pixel size. Conversely, sensitivity is generally improved by increasing pixel size. Thus, resolution and sensitivity are inversely proportional for a given optical size. Furthermore, higher resolution negatively impacts frame rate given fixed pixel readout rates.

What is desired is an effective method for trading off resolution for improved sensitivity and frame rate on a color image sensor with the typical color arrangement of a Bayer color filter array.

A common method for improving the sensitivity of an image sensor is to add the signal from adjacent pixels typically of the same color type. If performed off-chip (digitally), the resulting signal-to-noise (SNR) is only improved as:

$$SNR_{off} = \frac{\sqrt{n}\,S}{\sqrt{S+\sigma^2}} \quad [1]$$

where S is the signal of a single pixel, σ represents a fixed amplifier noise and n is the number of pixels combined together. The term sqrt(S) is the photon shot noise. This relationship assumes that all pixels have the same signal level and other noise sources, such as dark current shot noise, clocking noise, off-chip electronics and analog-to-digital (ADC) noise, are negligible compared to the sensor amplifier noise. This is commonly the case for a well-constructed camera system. The improvement in SNR reduces the resolution by a factor of 1/n but frame rate remains unchanged.

In the present invention, signals are added from adjacent pixels of the same color type within the sensor. In this case, the resulting signal-to-noise (SNR) is improved by:

$$SNR_{on} = \frac{nS}{\sqrt{nS+\sigma^2}} \quad [2]$$

The effect of the amplifier noise is reduced—particularly at low signal levels where the photon shot noise is low compared to the amplifier noise.

In US Patent Application Publication US 2006/0109352 A1 by Draijer, a structure is disclosed for combining pixels on-chip as discussed. In this case, it requires an additional temporary storage register with associated control lines to achieve the desired result. This extra structure adds to chip size that, in turn, lowers yield resulting in a higher cost device. In addition, the risk of charge transport errors, due to inherent manufacturing defects, is increased by requiring pixels to transfer both up and down as well as left and right in the process of combining pixels. This latter point is described in detail by Janesick in "Scientific Charge-Coupled Devices", SPIE Press, 2001, chapter 5.4 and illustrated on pg. 449-450. Lastly, once the process for combining pixels is completed, time is required to transfer pixels out of the temporary storage register into the readout register leading to a reduction in frame rate.

Consequently, a need exists to overcome the above-described drawbacks.

SUMMARY OF THE INVENTION

The present invention is directed to overcoming one or more of the problems set forth above. Briefly summarized, according to one aspect of the present invention, the present invention includes a charge-coupled device image sensor comprising: (a) a two-dimensional array of pixels having a plurality of rows and columns, the two-dimensional array comprising: (i) a plurality of gates arranged as a charge-coupled device; wherein the array further includes a plurality of charge-coupled devices that are arranged to be clocked by one or more common timing signals; (ii) a transition region, electrically connected to the array, having a first and second row of gates in which the second row is electrically mated into a plurality of first and second pairs of gates in which first pairs of gates are clocked by a first common timing signal and second pairs of gates are clocked by a second common timing signal; wherein the first row of gates are all clocked with a third common timing signal; and (b) a horizontal shift register adjacent the second row of gates for receiving charge from the second row of gates.

These and other aspects, objects, features and advantages of the present invention will be more clearly understood and appreciated from a review of the following detailed description of the preferred embodiments and appended claims, and by reference to the accompanying drawings.

ADVANTAGEOUS EFFECT OF THE INVENTION

The present invention has the advantage of color pixel binning without the cost inefficiencies of additional structures and without the time-consuming process of additional clocking cycles into and out of additional structures.

DETAILED DESCRIPTION OF THE INVENTION

As defined herein "common timing signal" means the gate is driven by a signal having the same electrical timing and same electrical voltage levels. In this regard, the common timing signal may come from either one or two or more physical input lines as long as they include the same electrical timing and electrical voltage levels.

Figure 1:
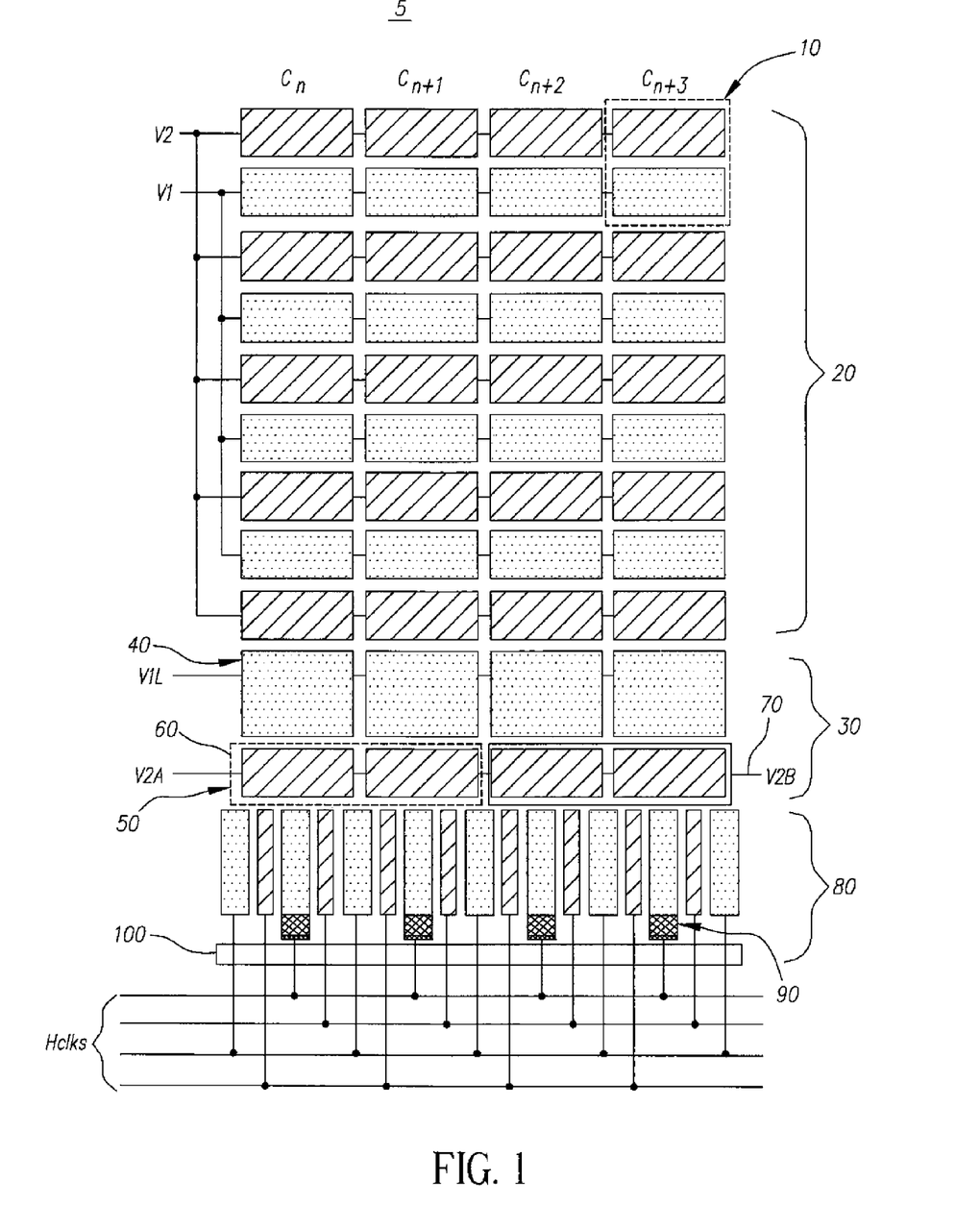
FIG. 1 is an illustration of an image sensor of the present invention and its associated HCCD.

Referring to FIG. 1, there is shown a true two-phase image sensor architecture in which one pixel 10 (indicated by the dashed line) includes two gates, as is well known in the art. For further reference on a true two-phase image sensor, see U.S. Pat. No. 4,613,402. Assuming an n-channel CCD (i.e., NMOS structure), it is instructive to note that when both gates of the two-phase structure are at a low voltage then the signal within a pixel is shared among both gates. When one gate is at a high voltage and one gate is at a low voltage, then all the signal of a pixel will be contained under the gate that is at a high voltage. The voltages are reversed for a p-channel CCD (i.e., PMOS structure).

The image sensor 5 of the present invention includes the array of pixels 20, a transition region 30 electrically connected to it, and a horizontal shift register 80 electrically connected to the transition region 30. The transition region 30 includes a first portion 40 consisting of a line or row of gates (clocked by the common timing signal labeled as V1L) and a second portion 50 also consisting of a line or row of gates in which a first mated pairs of gates 60 (see dashed line) are clocked by the common timing signal labeled as V2A and the second mated pairs of gates 70 (see solid line) are clocked by the common timing signal labeled as V2B. It is noted that the first 40 and second row 50 of gates are made using the same true two-phase architecture as is used for gates of the pixel array and avoids the need for temporary storage regions. The array of pixels preferably includes a color filter spanning and covering the array for permitting electronic color representations of an image to be captured. A Bayer color filter array is preferably used although other color filter arrays may also be used. The Bayer color filter includes a repeating 2×2 array color pattern of:

B Gb

Gr R where B is blue; Gb is green-blue, Gr is green-red and R is red. This is noted since the present invention is for combining like-colored charge (i.e., binning). Although the present invention is described in terms of binning the reds, greens and blues together, the present invention may be used, with alternate electrical connections, for other colors of different color filter arrays as long as the same colors are binned together.

It is noted for clarity of understanding that the first portion 40 of the transition region is clocked by a first common timing signal and the second portion 50 includes a first mated pair 60 clocked by a second common timing signal and a second mated pair 70 clocked by a third common timing signal.

A horizontal charge-coupled device (HCCD) 80, also referred to as a horizontal shift register, is electrically connected to the second portion 50 of the transition region for receiving signals from the second portion 50. It is noted that the HCCD 80 can shift charge bi-directionally. A plurality of lateral overflow channels 90 are connected to the HCCD 80 and coupled to a lateral overflow drain 100 for removing charge from the HCCD that exceeds its capacity. See U.S. Pat. Nos. 5,130,774 and 6,624,453 for further details on the construction and operation of lateral overflow drains.

Figure 2A:
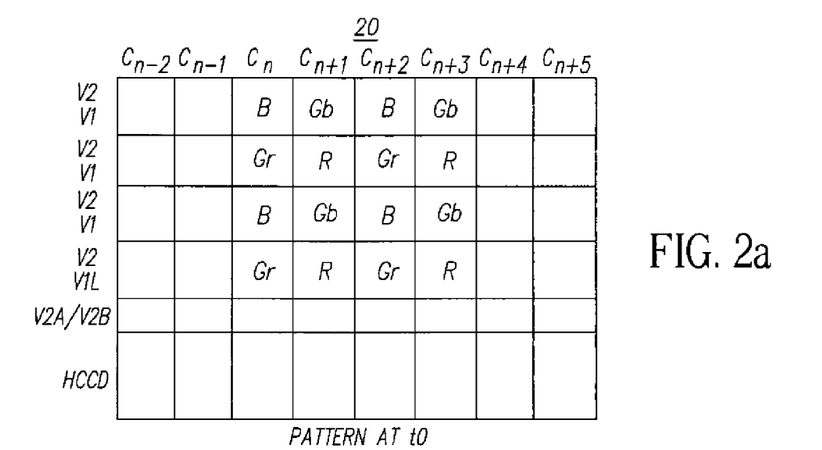
FIGS. 2a-2r are diagrams of the image sensor of the present invention illustrating shifting of charge.

Referring to FIG. 2a, the array 20 is shown having an image signal in only a portion of the array (a 4×4 array of pixels) for clarity of understanding. It is well known and to be understood that each pixel includes a signal therein. The below described operation is to be performed for all the pixels of the array in the same manner.

Figure 2B:
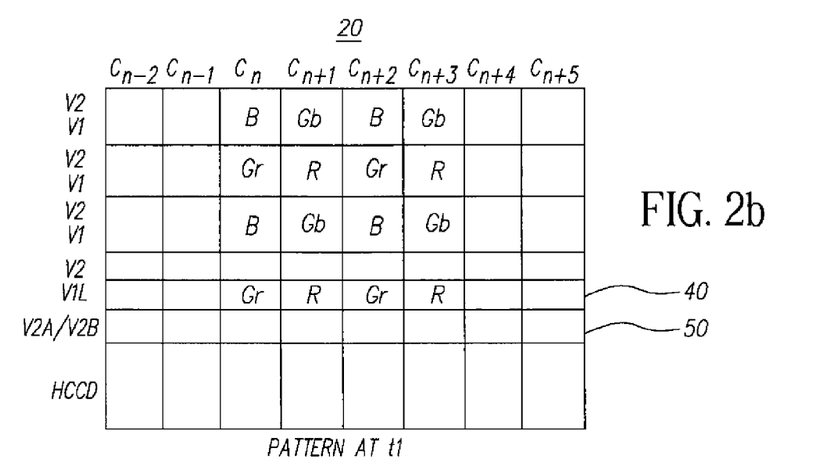
Figure 2C:
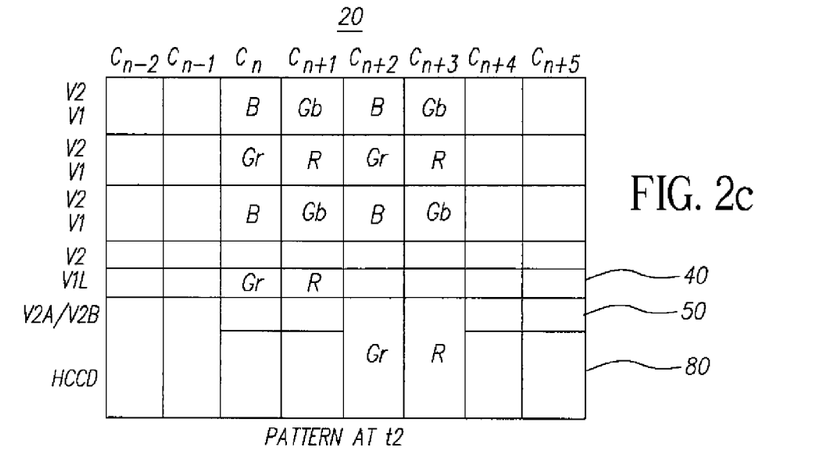
Figure 2D:
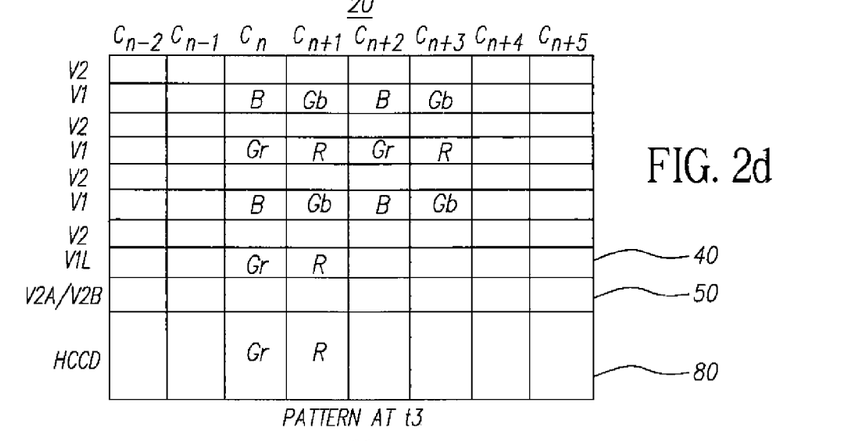
Figure 2E:
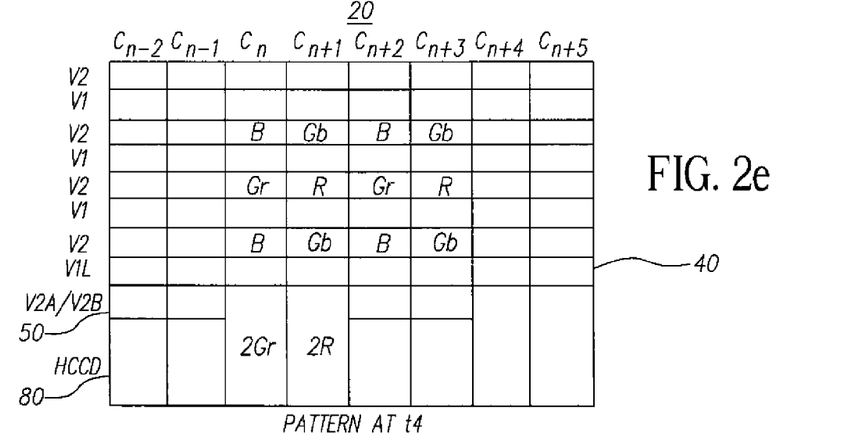
Figure 2F:
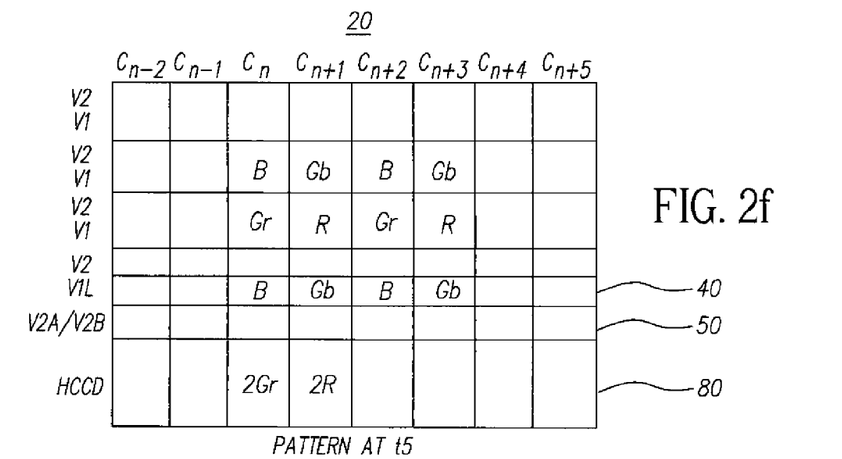
Figure 2G:
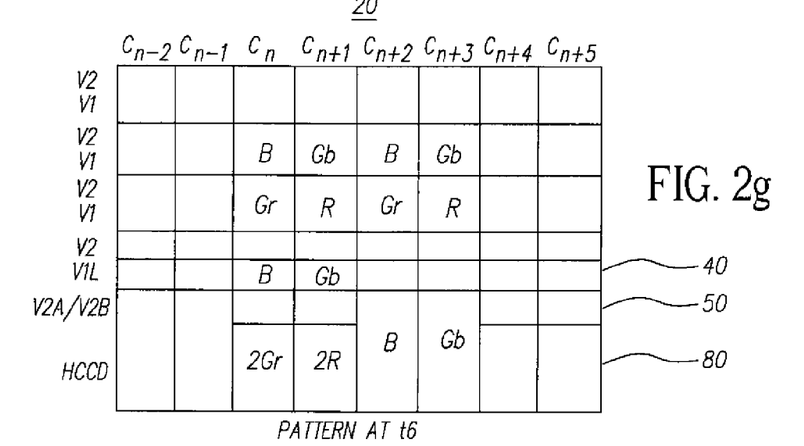
Figure 2H:
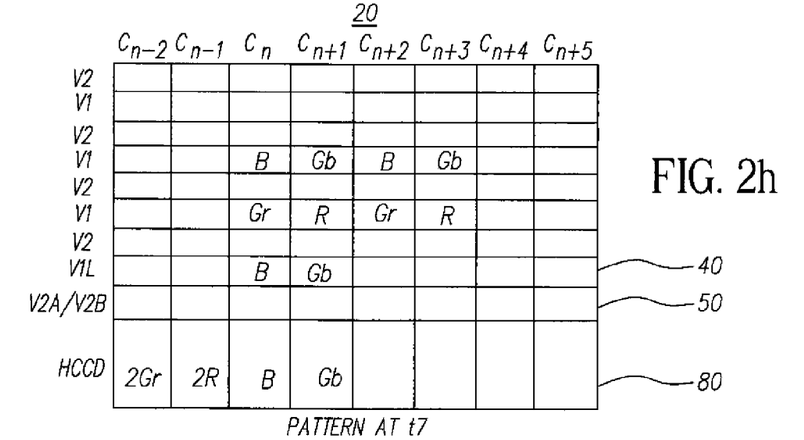
Figure 2I:
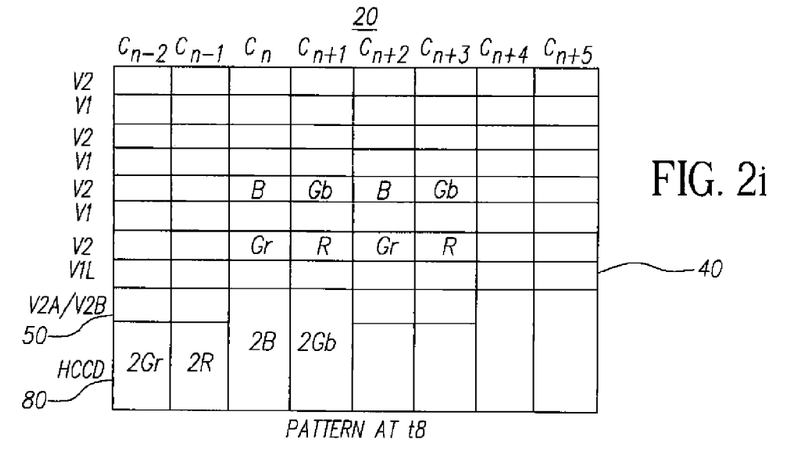
Figure 2J:
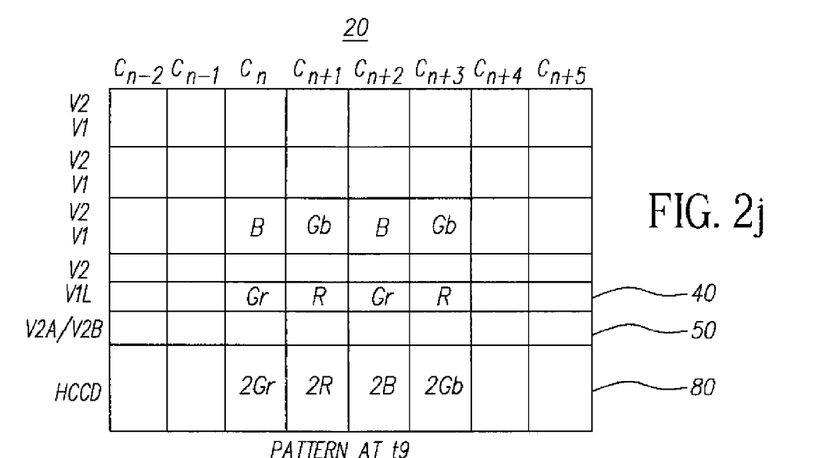
Figure 2K:
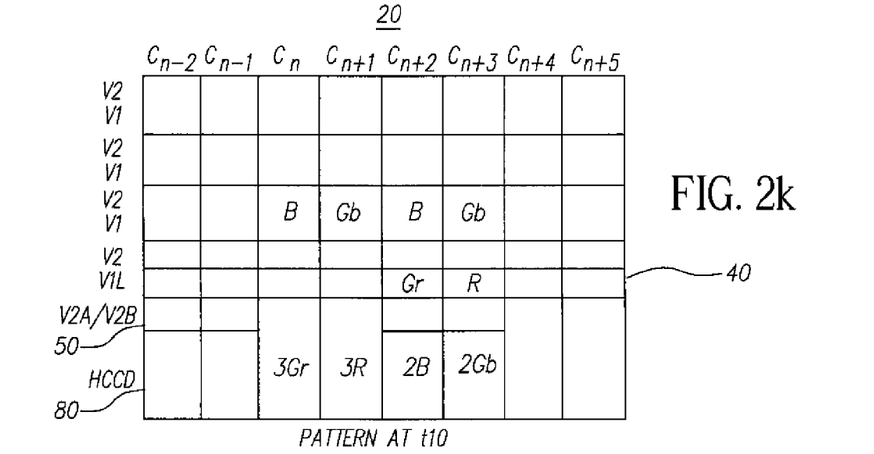
Figure 2L:
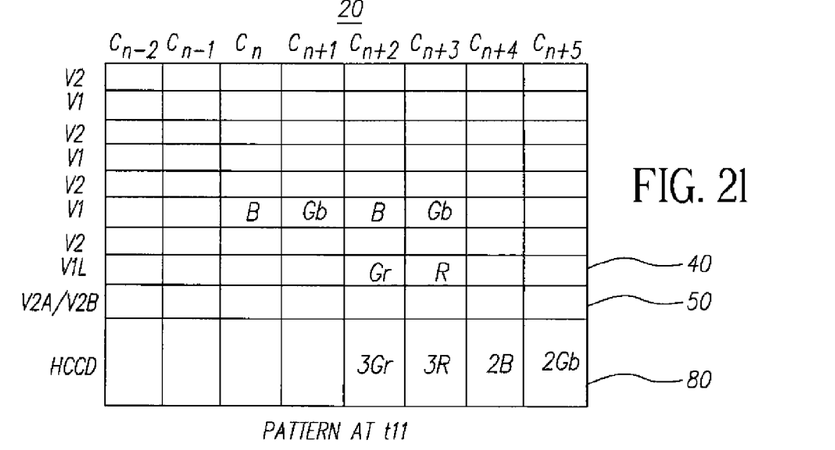
Figure 2M:
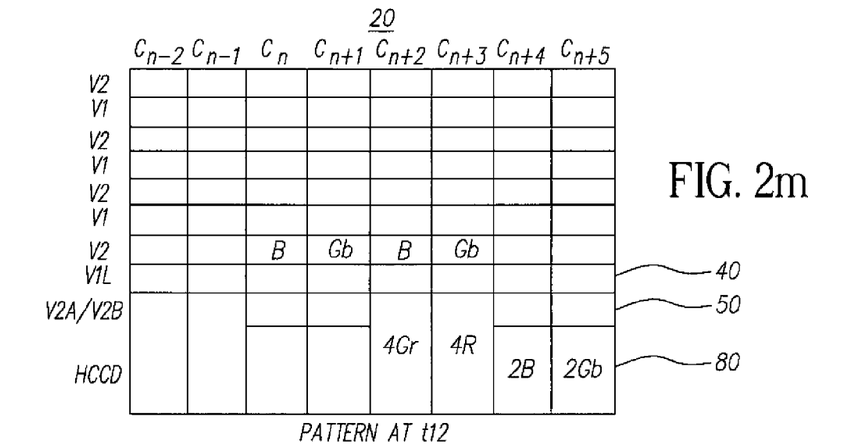
Figure 2N:
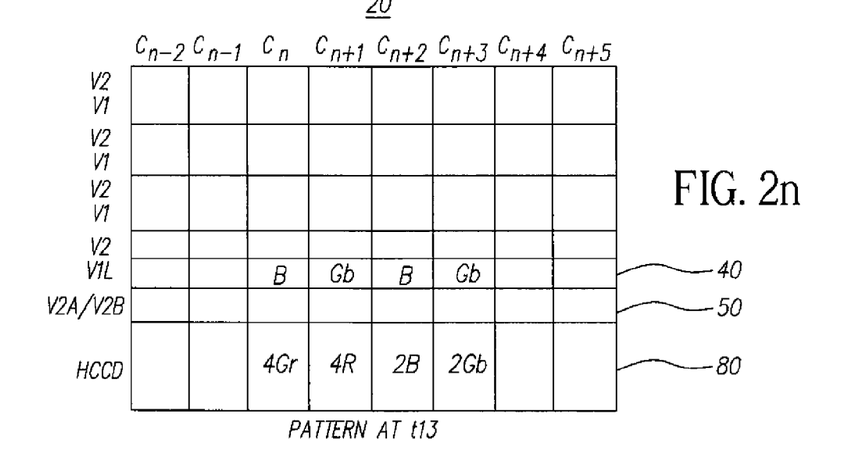
Figure 2O:
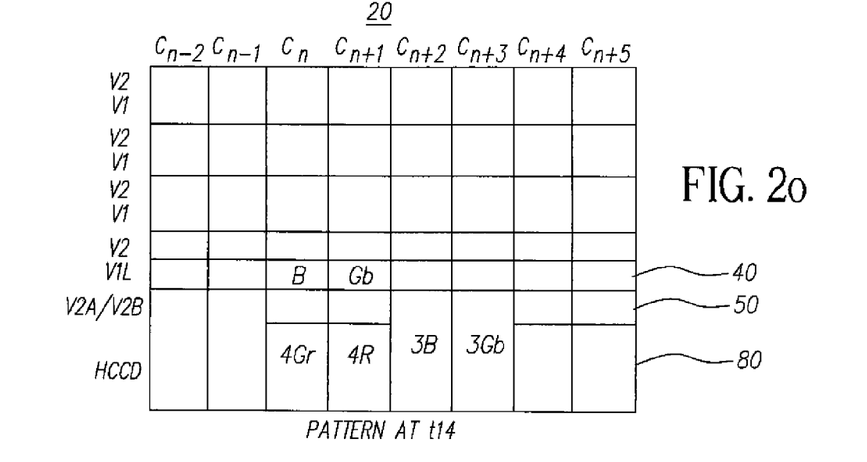
Figure 2P:
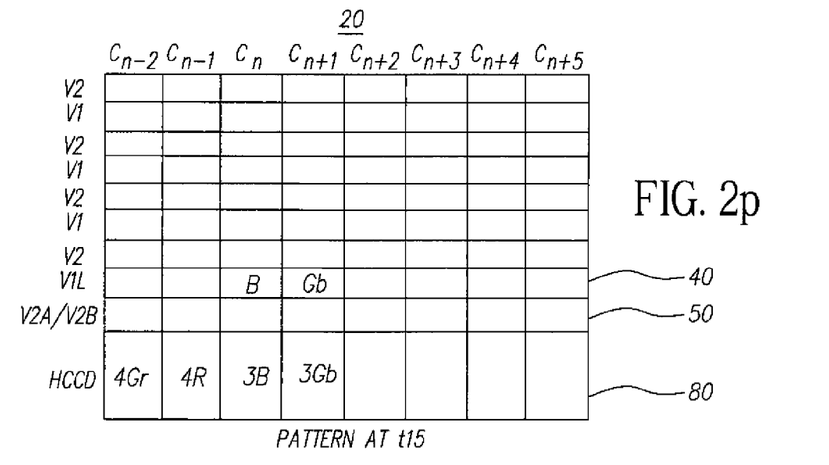
Figure 2Q:
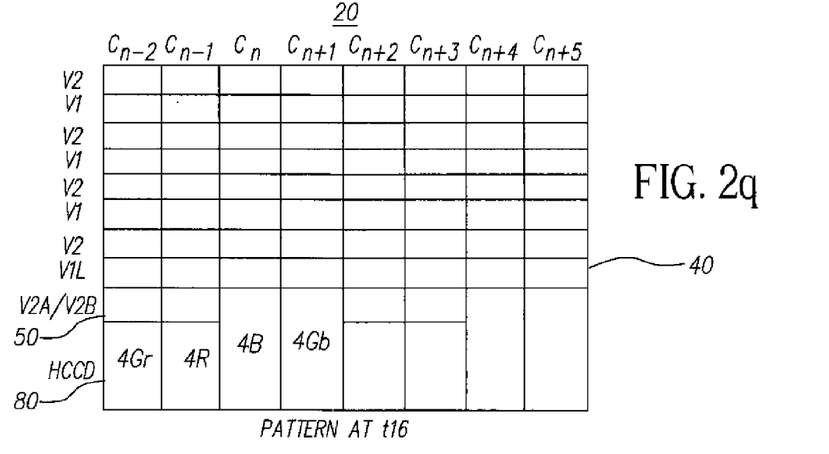
Figure 2R:
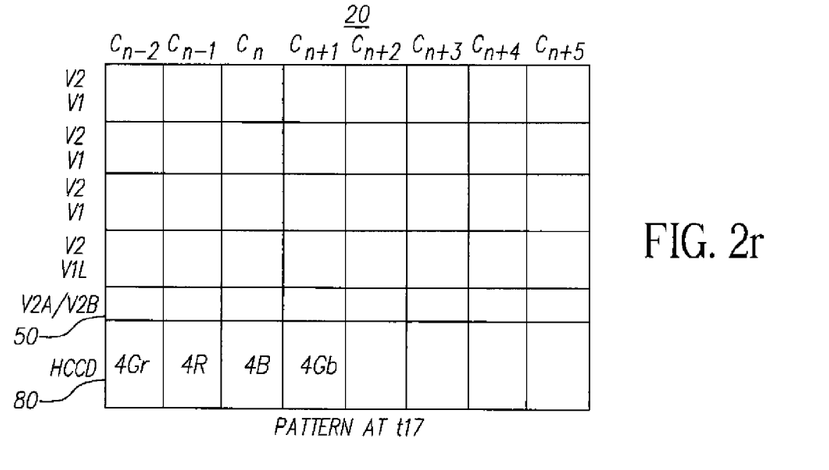
Figure 3:
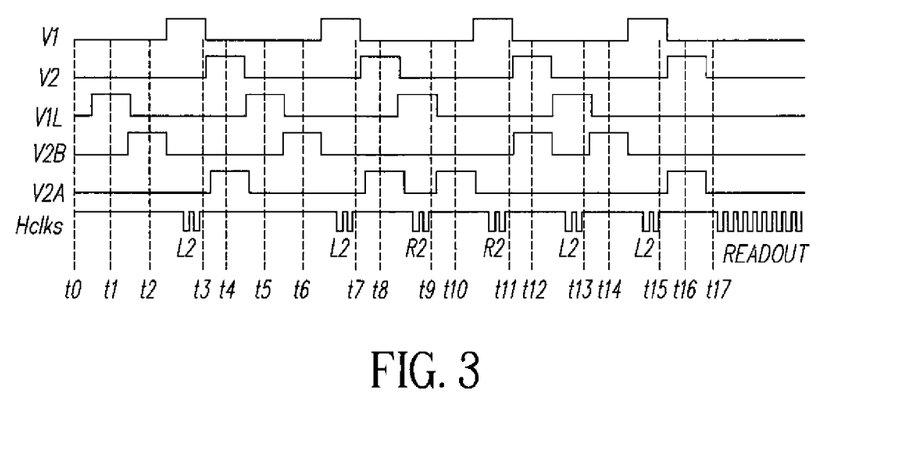
FIG. 3 is a timing diagram for FIGS. 2a-2r.

It is instructive to note that a timing diagram for FIGS. 2a-2r is shown respectively in FIG. 3. This timing diagram facilitates understanding of the timing and more specifically the "common timing signal." Turning now to the operation, the image is captured in the array of pixels 20 as shown in FIG. 2a (only 16 pixels with the image signal are shown for clarity) and the last row of signal or charge is transferred to the first portion 40 of the transition region as shown in FIG. 2b. As shown in FIG. 2c, the second mated pair 70 of Gr and R colors in the first portion 40 are then shifted into the second portion 50 and the HCCD 80 and eventually into only the HCCD 80. It is important to note that the V1L gate 40 is sized appropriately to hold the full capacity of one pixel while the voltage applied to the V1L gate is at the low voltage level. As shown in FIG. 2d, the second mated pair 70 of Gr and R charge in the HCCD 80 is shifted left until it respectively aligns with the first mated pair 60 of Gr and R charge remaining in the first portion 40. As shown in 2e, the Gr and R charges in the first portion 40 are shifted down into the second portion 50 and HCCD 80 so that they are binned or combined together (2Gr and 2R), and all the other lines in the array are also shifted down in the pixel array 20 into the next gate V2.

As shown in FIG. 2f, the combined charge is then shifted entirely into the HCCD 80 and the next line of charge from the array is shifted into the first portion 40. As shown in FIG. 2g, the second mated pair 70 of B and Gb charges are shifted into the second portion 50 and the corresponding HCCD 80. As shown in FIG. 2h, all the B and Gb charge is shifted into the HCCD 80 and shifted left so that the B and Gb charge are aligned with the same color in the first portion. As shown in 2i, the first mated pair 60 of B and Gb charge in the first portion 40 is shifted into the second portion 50 and HCCD 80 so that B and Gb are combined. The combined B and Gb charge (2B and 2Gb) is shifted entirely into the HCCD 80 as shown in 2j, and the next line of charge from the pixel array 20 is shifted into the first portion 40 while the charge in the HCCD 80 is shifted right so that the Gr and R in the HCCD 80 is aligned with the same color in the first portion 40. As shown in 2k, the first mated pair 60 of Gr and R charge in the first portion 40 is shifted into the second portion 50 and the HCCD 80 so that the 2Gr and 2R charge is respectively combined with a Gr and R to form a combined 3Gr and 3R charge. As shown in 2l, the 3Gr and 3R charge is shifted entirely into the HCCD 80 and all the charge in the HCCD 80 is shifted to the right so that the Gr and R charge are again aligned with the second mated pair 70 of Gr and R charge in the first portion 40.

As shown in 2m, the second mated pair 70 of Gr and R charge in the first portion 40 is shifted into the corresponding second portion 50 and HCCD 80 so that the 3Gr and 3R charge is combined with a Gr and R charge for forming a 4Gr and 4R charge. As shown in 2n, the 4Gr and 4R charge is shifted entirely into the HCCD 80, and all the charge in the HCCD 80 is shifted left so that the 2B and 2Gb in the HCCD 80 is aligned with the second mated pair 70 of B and Gb charge in the first portion 40. As shown in 2o, the second mated pair 70 of B and Gb charge in the first portion 40 is shifted into the corresponding second portion 50 and HCCD 80 so that the B and Gb are combined for forming a 3B and 3Gb charge. As shown in 2p, the second mated pair 70 of B and Gb charge in the second portion 50 is shifted entirely into the HCCD 80 and all the charge in the HCCD 80 is shifted left so that the B and Gb charges in the first portion 40 are aligned with the same colors in the HCCD 80. The first mated pair 60 of B and Gb charge is then shifted into the second portion 50 and HCCD 80 so that 4B and 4Gb are formed as shown in FIG. 2q. As shown in FIG. 2r, the charge in the second portion 50 is shifted entirely into the HCCD 80 and the charge in the HCCD 80 can then be shifted out of the HCCD 80 for processing as is well known in the art.

Referring to FIG. 3, there is shown the timing diagram for the image sensor 5 (V1 and V2), transitions regions 30 (V1L, V2A and V2B) and HCCD 80 (Hclks) for performing on-chip pixel binning. It is noted that the simplified Hclks timing pattern is used to represent the operation of all phases of the HCCD 80. The notation L2 represents shifting pixels in the HCCD 80 left two columns relative to the pixel array 20. Likewise, R2 represents shifting pixels in the HCCD 80 right two columns relative to the pixel array 20.

Figure 4A:
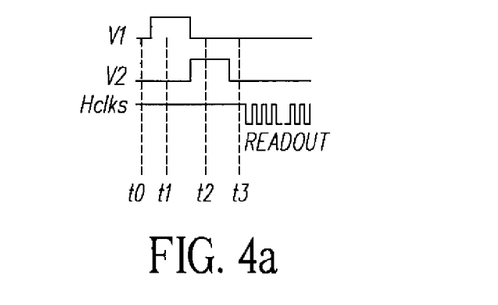
FIGS. 4a and 4b illustrate the true two-phase clocking method for the array of pixels of the present invention and illustrates clocking for the array of pixels and the transition region while in full resolution readout.
Figure 4B:
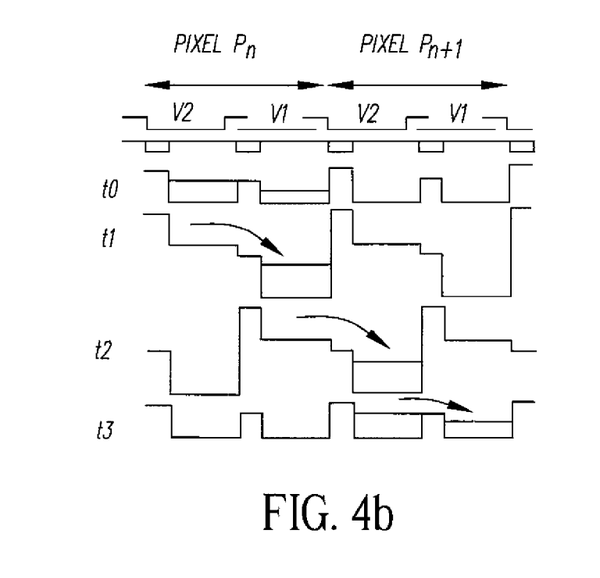

Although the present invention has been described in terms of pixel binning, full resolution of the image sensor is obtained by electrically connecting V1L to V1; and V2A and V2B to V2. The timing diagram for full resolution readout is shown in FIG. 4a. FIG. 4b illustrates the true two-phase clocking method of the image sensor 5 (discussed hereinabove) and applies to the charge transfer of the array of pixels 20 and transition region 30 while in full resolution readout.

The invention has been described with reference to a preferred embodiment. However, it will be appreciated that variations and modifications can be effected by a person of ordinary skill in the art without departing from the scope of the invention.

PARTS LIST 5 image sensor
10 pixel
20 pixel array
30 transition region
40 first portion of the transition region
50 second portion of the transition region
60 first mated pair of second portion
70 second mated pair of second portion
80 horizontal shift register or horizontal charge-coupled device (HCCD)
90 lateral overflow channels
100 lateral overflow drain

The invention claimed is:

1. A charge-coupled device image sensor comprising:
   (a) a two-dimensional array of pixels having a plurality of rows and columns, the two-dimensional array comprising:
      (i) a plurality of gates arranged as a charge-coupled device; wherein the array further includes a plurality of charge-coupled devices that are arranged to be clocked by one or more common timing signals;
      (ii) a transition region, electrically connected to the array, having a first and second row of gates in which the second row is electrically mated into a plurality of first and second pairs of gates in which first pairs of gates are electrically connected to a first common signal line clocked by a first common timing signal and second pairs of gates are electrically connected to a second common signal line clocked by a second common timing signal; wherein the first row of gates are electrically connected to a third common signal line clocked with a distinct third common timing signal; and
   (b) a horizontal shift register adjacent the second row of gates.

2. The charge-coupled device as in claim 1, wherein the horizontal shift register includes a lateral overflow drain for draining signal exceeding its capacity.

3. The charge-coupled device as in claim 1, wherein the horizontal shift register shifts bi-directionally.

4. A method for transferring charge in a charge-coupled device, wherein the charge-coupled device includes a transition region comprising a first and second row of gates and the second row is electrically mated into a plurality of first and second pairs of gates, the method comprising:
   (a) transferring charge from an array of charge-coupled devices into the first row of gates in the transition region;
   (b) selectively transferring pairs of charge from the first row of gates into a horizontal shift register, wherein one pair of the first and second pairs of gates in the second row of gates selectively transfer pairs of charge directly from the first row of gates into to the horizontal shift register while the other pair of the first and second pairs of gates maintain pairs of charge in first row of gates;
   (c) serially shifting the charge in the horizontal shift register in a first direction so that like color pixels are aligned with the remaining charge in the first row of gates;
   (d) transferring the remaining pairs of charge in the first row of gates into the horizontal shift register so that same colored pixel charge is combined;
   (e) transferring another additional row of charge from the array of charge-coupled devices into the first row of gates of the transition region; and
   (f) repeating (b) through (e) for the additional row of charge.

5. The method as in claim 4 further comprising shifting the charge in the horizontal shift register in an opposite second direction and repeating (b) through (e) for a third and a fourth additional row of charge from the array of charge-coupled devices.

* * * * *